US006628695B1

(12) United States Patent
Aldaz et al.

(10) Patent No.: US 6,628,695 B1
(45) Date of Patent: Sep. 30, 2003

(54) MONOLITHICALLY INTEGRATED MODE-LOCKED VERTICAL CAVITY SURFACE EMITTING LASER (VCSEL)

(75) Inventors: Rafael I. Aldaz, Mountain View, CA (US); Gordon A. Keeler, Menlo Park, CA (US); Vijit A. Sabnis, Menlo Park, CA (US); James S. Harris, Jr., Stanford, CA (US); David A.B. Miller, Stanford, CA (US)

(73) Assignee: The board of trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 10/175,659

(22) Filed: Jun. 19, 2002

Related U.S. Application Data
(60) Provisional application No. 60/362,839, filed on Mar. 7, 2002.

(51) Int. Cl.[7] ............................................... H01S 3/08
(52) U.S. Cl. .......................................... 372/96; 372/92
(58) Field of Search ............................. 372/43, 45, 46, 372/49, 75, 96, 98, 99, 101, 103, 50, 47, 18

(56) References Cited

U.S. PATENT DOCUMENTS

| | | | | |
|---|---|---|---|---|
| 5,461,637 A | * | 10/1995 | Mooradian et al. | 372/92 |
| 5,574,738 A | | 11/1996 | Morgan | 372/28 |
| 5,627,853 A | * | 5/1997 | Mooradian et al. | 372/92 |
| 5,754,578 A | * | 5/1998 | Jayaraman | 372/50 |
| 6,026,108 A | * | 2/2000 | Lim et al. | 372/50 |
| 6,026,111 A | * | 2/2000 | Jiang et al. | 372/96 |
| 6,243,407 B1 | * | 6/2001 | Mooradian | 372/92 |
| 6,343,090 B1 | * | 1/2002 | Yoo et al. | 372/96 |
| 6,404,797 B1 | * | 6/2002 | Mooradian | 372/96 |
| 6,438,149 B1 | * | 8/2002 | Tayebati et al. | 372/45 |
| 2002/0031155 A1 | * | 3/2002 | Tayebati et al. | 372/50 |
| 2002/0080836 A1 | * | 6/2002 | Hwang | 372/45 |
| 2002/0176473 A1 | * | 11/2002 | Mooradian | 372/92 |

OTHER PUBLICATIONS

Orazio Svelto, *Principles of Lasers*, translated by David C. Hanna, 4th edition, Plenum, pp. 330–364.
Jiang W., et al., "Femtosecond Periodic Gain Vertical–Cavity Lasers", IEEE Photonics Technology Letters, vol. 5, No. 1, Jan. 1993, pp. 23–25.
Jiang W., et al., "Electrically pumped mode–locked vertical–cavity semiconductor laser", Optics Letters, vol. 18, No. 22, Nov. 1993, pp. 1937–1939.
Hoogland S., et al., "Passively Mode–Locked Diode–Pumped Surface–Emitting Semiconductor Laser", IEEE Photonics Technology Letters, vol. 12, No. 9, Sep. 2000, pp. 1135–1137.
Dowd P., et al., "Mode–Locking of an InGaAs VCSEL in an External Cavity", LEOS 1995, IEEE, 8[Th] Annual Meeting Conference Proceedings, vol. 2, pp. 139–140.
Haring, R., et al., "Passively Mode–Locked Diode–Pumped Surface–Emitting Semiconductor", CLEO 2000, Technical Digest (IEEE Cat. No. 00CH37088), pp. 97–98.
Nikolajeff F., et al., "Spatial–mode control of vertical–cavity lasers with micromirrors fabricated and replicated in semiconductor materials", Applied Optics, vol. 38, No. 14, May 1999, pp. 3030–3038.

* cited by examiner

*Primary Examiner*—Paul Ip
*Assistant Examiner*—Tuan Nguyen
(74) *Attorney, Agent, or Firm*—Lumen Intellectual Property Services Inc.

(57) ABSTRACT

A monolithically integrated, mode-locked vertical cavity surface emitting laser (VCSEL) for emitting ultrafast high power pulses. The resonator of the VCSEL has an active medium for emitting a radiation, a spacer for extending the resonator to a length L at which a significant number N of axial modes of the radiation are supported in the resonator and a saturable absorber for mode-locking. The VCSEL has an arrangement for stabilizing the resonator such that one transverse mode of the radiation is supported within the resonator. The VCSEL also has an arrangement for compensating dispersion of the radiation occurring in the resonator.

18 Claims, 6 Drawing Sheets

MONOLITHICALLY INTEGRATED MODE-LOCKED VERTICAL CAVITY SURFACE EMITTING LASER (VCSEL)

RELATED APPLICATIONS

This application is based on the Provisional Patent Application No. 60/362,839 filed on Mar. 7, 2002 and herein incorporated by reference.

FIELD OF THE INVENTION

The present invention relates generally to vertical cavity surface emitting lasers (VCSELs), and in particular to a monolithically integrated VCSEL whose resonator cavity is designed for mode-locking.

BACKGROUND OF THE INVENTION

The vertical cavity surface emitting laser (VCSEL) is a well-known type of semiconductor laser. Its advantages include compactness, single axial mode emission, high quality circular beam shape, ease of mass production, and simple testability. Most VCSELs have a short resonator cavity, which limits their longitudinal or axial lasing modes to one.

Mode-locking is a known method capable of delivering short and high power pulses of radiation. Lasers with sufficiently long resonator cavities to support a significant number of axial lasing modes take advantage of mode-locking to produce a superposition of the axial modes yielding ultrashort pulses with very high peak powers. For more information on the theory of mode-locking and fundamental mode-locking techniques the reader is referred to Orazio Svelto, Principles of Lasers, translated by David C. Hanna, $4^{th}$ edition, Plenum, pp. 330–364. A number of mode-locking techniques rely on a shutter or saturable absorber to mode-lock a number of the axial modes supported by the resonator cavity. Specifically, passive mode-locking takes advantage of the high peak power of the pulses as criteria for the saturable absorber to force the laser to run in mode-locked condition.

Because mode-locking is capable of generating a train of ultrashort pulses with high peak powers and low jitter it has many applications in a variety of fields. Short optical pulses have a large spectral bandwidth and can be used to generate multiple wavelength channels for telecommunication systems such as wavelength-division-multiplexed (WDM) and dense WDM (DWDM) optical communications networks. A high pulse repetition rate can also be utilized as a source for optical time-division-multiplexed (TDM) signals or for timing control signals in sampling applications. High repetition rate and low jitter mode-locked pulses can also be used for clock distribution in electronic systems.

It has been recognized that combining the advantages of VCSEL lasers with mode-locking would be of great benefit. In fact, the prior art teaches various structures and methods for using VCSELs in an external cavity mode-locking arrangement. For example, Jiang W., et al., "Femtosecond Periodic Gain Vertical-Cavity Lasers", IEEE Photonics Technology Letters, Vol. 5, No. 1, January 1993, pp. 23–25 discloses an external cavity actively mode-locked VCSEL. This device is optically pumped by a mode-locked Ti:Sapphire laser. Jiang W., et al., "Electrically pumped mode-locked vertical-cavity semiconductor laser", Optics Letters, Vol. 18, No. 22, November 1993, pp. 1937–1939 also teach an externally mode-locked VCSEL which is electrically rather than optically pumped. Hoogland S., et al., "Passively Mode-Locked Diode-Pumped Surface-Emitting Semiconductor Laser", IEEE Photonics Technology Letters, Vol. 12, No. 9, September 2000, pp. 1135–1137 also teach an optically pumped VCSEL which is mode-locked using a saturable absorber mirror forming a part of an external cavity. For further examples the reader is referred to Dowd P., et al., "Mode-Locking of an InGaAs VCSEL in an External Cavity", LEOS 1995, IEEE, $8^{Th}$ Annual Meeting Conference Proceedings, Vol. 2, pp. 139–140; Haring, R., et al., "Passively Mode-Locked Diode-Pumped Surface-Emitting Semiconductor Lasers", CLEO 2000, Technical Digest (IEEE Cat. No. 00CH37088), pp. 97–98.

The disadvantages of using VCSELs in external cavity arrangements include large size, alignment problems and poor scalability. In fact external mode-locking is incompatible with one of the major advantages of VCSELs, namely the ability to manufacture them in dense arrays or integrate them into optoelectronic chips. Therefore, VCSELs that are mode-locked with an external cavity cannot be used in most of the desired applications that stand to gain the most from short, stable and high power pulses.

In accordance with another approach, it has also been proposed to lengthen the VCSEL structure and filter transverse modes that tend to naturally arise in long resonator cavities. This approach is discussed, e.g., by Nikolajeff F., et al., "Spatial-mode control of vertical-cavity lasers with micromirrors fabricated and replicated in semiconductor materials", Applied Optics, Vol. 38, No. 14, May 1999, pp. 3030–3038. This reference teaches the fabrication of micromirrors on substrates to spatially filter transverse modes in the far field for external cavity lasers and suggests ways of implementing the idea on monolithic cavities.

U.S. Pat. No. 5,574,738 to Morgan teaches yet another approach to derive high frequency pulses from a VCSEL. Specifically, Morgan teaches a GHz-range frequency-modulated laser using a VCSEL with a saturable absorber contained within the VCSEL's distributed Bragg reflector to self-pulsate the VCSEL in the GHz regime. The repetition frequency is modulated with current, saturable absorber biasing or cavity design. The principles of self-pulsation are similar to those of Q-switching or spiking in which a build-up of population inversion while saturable absorber losses are high causes a high power laser pulse to develop when the saturable absorber losses drop. Thus, the self-pulsation technique taught by Morgan is implemented with a single axial mode in a short VCSEL.

In contrast with the phenomenon of self-pulsation used by Morgan, mode-locking requires a large number of axial modes to be supported by the VCSEL. In mode-locking the function of the saturable absorber is to absorb slow and low power components of the superposition produced the randomly phased axial modes. Meanwhile, fast and high power components of the superposition will saturate the absorber and pass through it. Thus, during mode-locking the saturable absorber induces the laser to yield high power mode-locked pulses.

The operation of the absorber in mode-locking is also in stark contrast with its operation in Q-switching, where it is used to prevent lasing in all modes while a population inversion is being build up. A drop in the absorption of the absorber upon saturation causes the laser to produce a pulse also referred to as giant pulse. The giant pulse is not a result of any particular superposition of axial modes. A Q-switched laser with a saturable absorber has build up times, as well as rise and fall times that depend on the cavity design and never reach mode-locking. In Q-switching the laser is not continuously on; lasing action is being turned on and off. In a mode-locked laser, on the other hand, all the modes are lasing continuously. It should also be noted that the repetition rates in mode-locking are determined by the cavity length while in Q-switching is determined by how fast can inversion be reached.

In fact, none of the prior art teachings can be used to devise a monolithically integrated mode-locked VCSEL, i.e., a VCSEL that is integrated in one device and does not require the use of an external cavity for mode-locking operation. That is because simply increasing the cavity size of a conventional VCSEL introduces significant problems related to resonator stability and dispersion. An additional problem relates to the bulk associated with the addition of mode-locking components, and associated loss of compactness. Therefore, it would be a major advance in the art of semiconductor lasers to provide a new type of VCSEL that combines the compactness and ease of mass production of conventional VCSELs with the advantageous properties of mode-locked lasers.

OBJECTS AND ADVANTAGES

In view of the above shortcomings of the prior art, it is a primary object of the invention to provide a monolithically integrated VCSEL that can be mode-locked to deliver high frequency and high power ultrafast pulses. In particular, it is the object of the invention to ensure resonator stability in VCSELs with extended cavities and to compensate for dispersion to thus enable further pulse compression.

It is another object of the invention to provide for monolithically integrated mode-locked VCSELs, which are compact and easy to mass-produce.

These and numerous other advantages of the present invention will become apparent upon reading the following description.

SUMMARY

The objects and advantages of the invention are achieved by a monolithically integrated, mode-locked vertical cavity surface emitting laser (VCSEL) in accordance with the invention. The resonator of the VCSEL has an active medium for emitting a radiation, a spacer for extending the resonator to support a significant number of axial modes of the radiation and a saturable absorber for establishing a certain phase condition between these modes to mode-lock them. The VCSEL has an arrangement for stabilizing the resonator such that diffraction losses are minimized and furthermore, only one transverse mode of the radiation is supported within the resonator. Additionally, the VCSEL is provided with an arrangement for compensating dispersion of the radiation occurring in the resonator.

The resonator is defined between a first reflector and a second reflector. Conveniently, at least one of these reflectors is a distributed Bragg reflector (DBR). In one embodiment of the invention the arrangement for stabilizing the resonator includes a specific curvature of the at least one DBR. In addition, the aperture of the at least one DBR is defined to ensure single transverse mode operation. Furthermore, the arrangement for stabilizing the resonator can include a resonator length as a geometric limitation. In fact, it is preferred that the length of the resonator be equal to twice the radius of curvature of the DBR reflector such that the resonator is a half confocal resonator. In the same embodiment or in a different embodiment the arrangement for compensating dispersion can be a chirp introduced into the at least one DBR reflector.

The arrangement for stabilizing the resonator can also include a lensing element. The lensing element can be provided independent of whether the resonator does or does not have a curved reflector. Preferably, the lensing element is a layered microlens embedded inside the resonator between the reflectors.

The monolithically integrated VCSEL and all of its components including the arrangements for stabilizing the resonator and dispersion compensation can be built on a single substrate. Preferably, the substrate is used as the spacer in this case. Any suitable pumping device can be used to pump the active medium residing in the resonator. The pumping device can be an electrical pumping device delivering a suitable current to the active medium. Alternatively, the pumping device can be an optical pumping device injecting pump radiation into the resonator to pump the active medium. When using an optical pumping device it is advantageous to place the saturable absorber at an opposite end of the resonator opposite from where the active medium is located. Also, the pump radiation should preferably be delivered through the reflector at the end where the active medium is located. The active medium can be any suitable lasing medium including a medium with quantum wells.

The invention further provides for a method of mode-locking the monolithically integrated VCSEL. Specifically, the resonator is preferably extended to support a significant number of axial modes of the radiation emitted by the active medium. The more axial modes are available, the more modes become available for mode-locking and producing the mode-locked output pulse. In some situations 5 or even fewer axial modes may be sufficient to obtain satisfactory pulses of output radiation.

A detailed description of the invention and the preferred and alternative embodiments is presented below in reference to the attached drawing figures.

DETAILED DESCRIPTION

Figure 1:
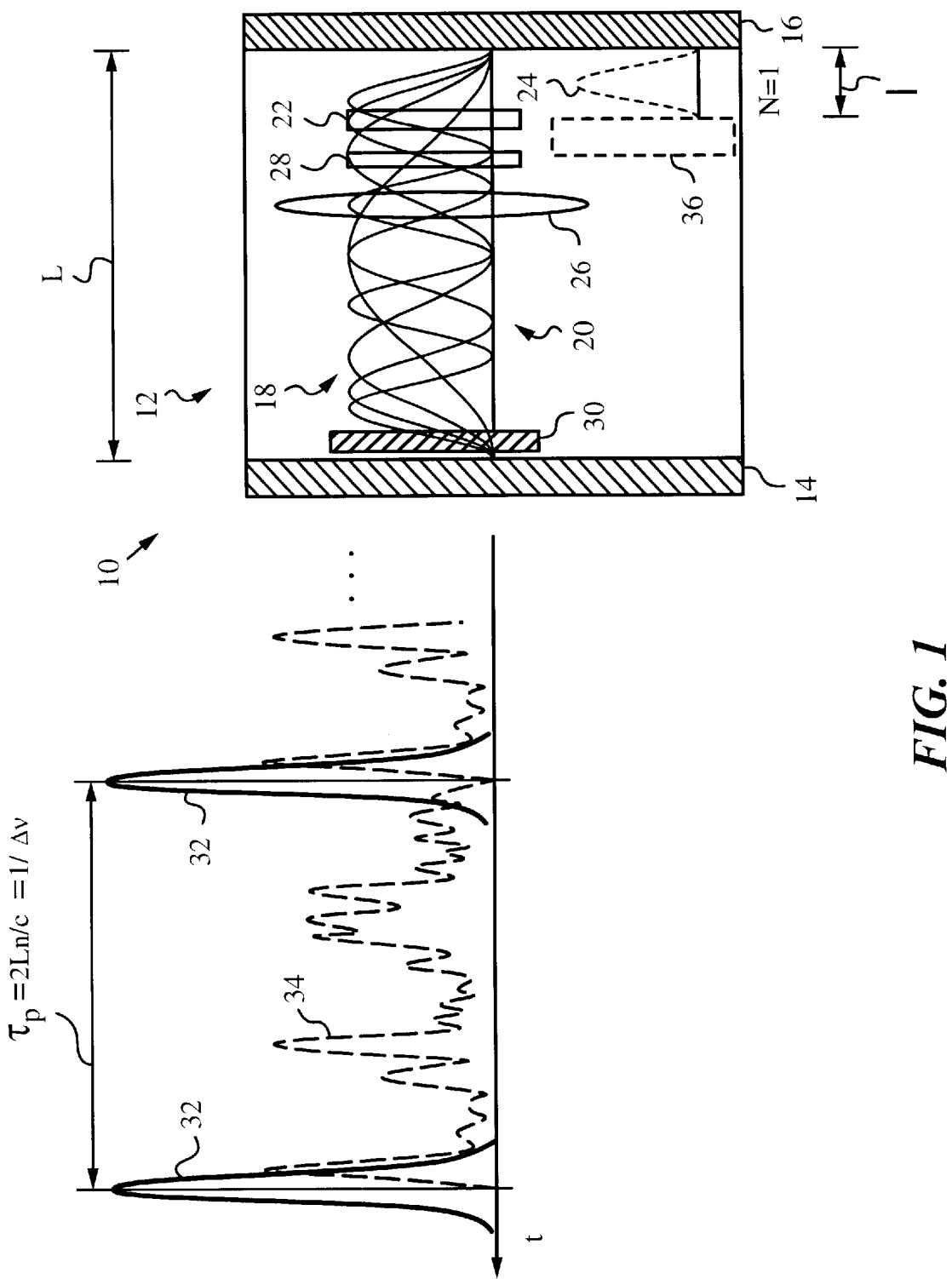
FIG. 1 is a diagram illustrating the principles of a mode-locked vertical cavity surface emitting laser (VCSEL) in accordance with the invention.

The invention will be best understood by initially referring to the diagram in FIG. 1 illustrating the general principles of a monolithically integrated, vertical cavity surface emitting laser 10 (VCSEL) in accordance with the invention. VCSEL 10 has a resonator cavity or resonator 12 of length L delimited by a first reflector 14 and a second reflector 16. Length L is sufficiently large to support a significant number N of longitudinal or axial modes 18 of a radiation 20 under the gain bandwidth of active medium 22 located in resonator 12. In this diagram axial modes 18 are indicated by their field intensities related to the square of the electric field ($E^2$).

The specific number N of axial modes 18 required for mode-locking will depend on the application and may range from 5 or even fewer to hundreds of modes, as will be appreciated by one skilled in the art.

Although a significant number of axial modes 18 are necessary for effective mode-locking, it is not desirable for resonator 12 to support many transverse modes. In fact, it is preferred that resonator 12 support only one transverse mode, i.e., the fundamental $TEM_{00}$ mode. Thus, to prevent resonator 12 from supporting numerous transverse modes made possible by extended length L, VCSEL 10 has a device 26 for stabilizing resonator 12. In this case, device 26 is schematically designated as a lens, but other elements including apertures and/or curved reflector geometries can be used as well, as described below. Lens 26 focuses radiation 20 near the axis of resonator 12 to suppress transverse modes beyond the fundamental $TEM_{OO}$. Additionally, a device 28 for preventing dispersion of radiation 20 is provided in cavity 12. In this case device 28 is a chirped wavelength-dependent retarder, but it can be another dispersion compensating device, as described below.

Resonator 12 also contains a saturable absorber 30 for establishing a certain phase relationship between modes 18. For example, a constant phase difference $\phi$ may be set up between successive modes 18 by saturable absorber 30. Alternatively, absorber 30 can be used to establish a linearly or even non-linearly varying phase difference between successive modes 18, as will be appreciated by those skilled in the art.

The phase difference $\phi$ brings about output of mode-locked pulses 32 obtained from a superposition of modes 18 at phase difference $\phi$. The typical superposition of modes 18 output by resonator 12 without mode-locking is indicated by the dashed line 34 for comparison purposes. The period $\tau_p$ between pulses 32 is equal to:

$$\tau_p = \frac{2Ln}{c} = \frac{1}{\Delta f},$$

where c is the speed of light, n is the index of refraction of resonator 12 and $\Delta f$ is the free spectral range or separation between axial modes 18.

The spacing of modes 18 in frequency is given by:

$$\Delta f = \frac{c}{2Ln},$$

which is the same as the repetition rate of the pulses or the inverse of period $\tau_p$ between pulses 32. The mode spacing in wavelength can be calculated as:

$$\Delta \lambda = \frac{\lambda^2}{2Ln}$$

The number of modes 18 depends on how much bandwidth VCSEL 10 is able to mode-lock. Typical bandwidths in edge emitters are around 5 nm, however this could vary by a few nm. When resonator 12 has a length L=500 $\mu$m then at 980 nm center wavelength the wavelength spacing is 2.72 Å and the total number N of modes 18 is around 18 (N=18). If pulses 32 are transform-limited, meaning that dispersion has been controlled, then pulses 32 can be as short as 640 fs. On the other hand, if resonator 12 has a much shorter length, e.g., L=136 $\mu$m, then the wavelength spacing could be up to 1 nm and mode-locking the same bandwidth of 5 nm to obtain the same pulse duration of 640 fs requires only 5 modes 18 (N=5). Thus, the actual number N of modes 18 required to achieve mode-locking and generate the desired pulses 32 will vary substantially, typically from 5 or even less to several hundred or even more. Meanwhile, length L of resonator 12 can be varied from about 100 $\mu$m at which the repetition rate of pulses 32 is about 426 GHz to hundreds of $\mu$m.

For comparison purposes, a prior art resonator of length l is indicated between reflector 16 and a dashed reflector 36. Length l is short in comparison to length L and only sufficient to support one axial mode 24, N=1, of radiation under the gain spectrum. The presence of only one axial mode 24 precludes the phenomenon of mode-locking from occurring altogether.

Figure 2:
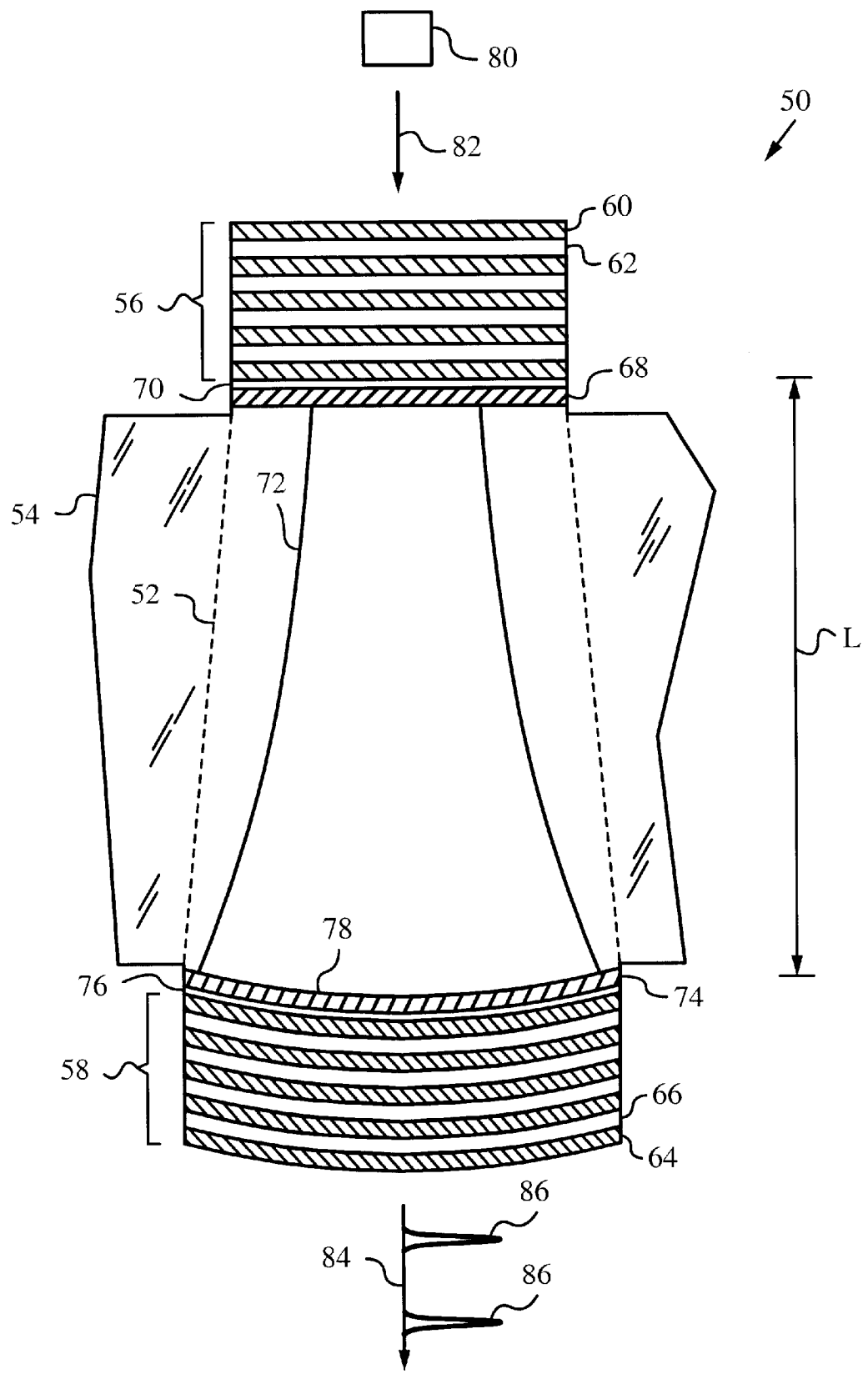
FIG. 2 is a cross sectional view of an optically pumped mode-locked VCSEL in accordance with the invention.

The above principles can be employed to produce a large variety of VCSELs in accordance with the invention. One particular embodiment of a monolithically integrated, mode-locked VCSEL 50 is illustrated in FIG. 2. VCSEL 50 has a resonator 52 of length L defined in a substrate 54 between a top or first reflector 56 and a bottom or second reflector 58. First reflector 56 is a flat distributed Bragg reflector (DBR) built up of a number of alternating layers 60, 62. Second reflector 58 is a curved DBR built up of a number of alternating layers 64, 66. DBR 56 and DBR 58 can be fabricated by epitaxial semiconductor growth or deposition of dielectrics. DBR 56 and DBR 58 may have different numbers of layers, and many different materials and compositions can be chosen for their fabrication. Preferably, however, alternating layers 60, 62 and 64, 66 are alternating AlGaAs/GaAs epitaxial layers, or alternating $SiO_2$, $Si_xN_y$ dielectric layers, each with an optical thickness of one-quarter wavelength of a radiation 72 to be reflected within resonator 52.

An active medium 68 is positioned at top end of resonator 52 below first DBR 56 and is separated from DBR 56 by a spacing layer 70. Active medium 68 is any suitable material providing optical gain in a wavelength range of interest and able to generate radiation 72 in that wavelength range. For example, active medium 68 is a material having defined therein one or more quantum wells using gain materials and barrier materials well-known to those skilled in the art. Preferably, medium 68 uses InGaAs quantum wells with GaAs well barriers (not shown). Other material, still within the GaAs system, such as GaInNAs(Sb) can be used to extend the design to longer wavelengths. Furthermore, the devices could also be implemented using other material systems such as InP with InGaAsP or InGaAlAs quantum wells.

A saturable absorber 74 is located at the bottom end of resonator 52 opposite from the end where active medium 68 is located. Absorber 74 is separated from bottom DBR 58 by a spacing layer 76. Absorber 74 can be a layer of semiconductor material. Such materials are well-known to exhibit saturable absorption. Preferably, the material is grown in such a way as to reduce the time scale of absorption saturation recovery or carrier lifetime. Known methods for such reduction include low-temperature growth of GaAs, proton implantation, or incorporation of absorber 74 in a reverse-biased diode. Quantum well materials are also known to have desirable absorption saturation behavior and can be used as absorber 74.

In the present embodiment absorber 74 is grown on a curved surface 78 of substrate 54. In fact, the radius of curvature of surface 78 determines a radius of curvature of absorber 74 as well as a radius of curvature R of curved DBR 58. Curved surface 78 in substrate 54 can be fabricated by any known method including techniques such as diffusion-limited etching or reflow and shape-transfer etching. For more information on the technique of diffusion limited wet etching the reader is referred to Y. Kim, et al., "Semiconductor Microlenses Fabrication by One-Step Wet Etching", IEEE Photonics Technology Letters, Vol. 12, No. 5, 2000, pp. 507–509.

Substrate 54 is selected from materials that are transparent at the wavelength of radiation 72. In most wavelength ranges, GaAs is a suitable material for substrate 54. Semi-insulating GaAs substrates are preferred to reduce free-carrier absorption losses. A person skilled in the art will appreciate that other materials can be used as substrate 54.

An optical pumping device 80 that emits a pump radiation 82 is provided for optically pumping active medium 68 of VCSEL 50 to induce generation of radiation 72. Device 80 is any suitable optical source such as a laser, e.g., a diode laser. In order to admit pump radiation 82 into resonator 52 first DBR 56 is transparent at the wavelength of pump radiation 82. At the same time, DBR 56 is highly reflective at the wavelength of radiation 72 generated by active medium 68. Curved DBR 58 is adjusted to be reflective at the wavelength of radiation 72 but allow a sufficient amount of radiation 72 to be coupled out of resonator 52 in the form of output radiation 84.

In accordance with the above-mentioned principles of the invention, length L of resonator 52 is set to be sufficient to support a significant number of axial modes of radiation 72. In setting length L substrate 54 is used as a spacer that extends resonator 52 to desired length L. In other words, the thickness of substrate 54 should be selected based on desired length L of resonator 52.

The material of substrate 54 tends to disperse radiation pulses traveling inside resonator 52. The dispersion of radiation 72 and decreased stability of resonator 52, i.e., increase of diffraction losses and generation of multiple transverse modes of radiation 72, arising due to extended length L are mitigated by providing an arrangement for compensating dispersion and an arrangement for stabilizing resonator 52. In the present case, the arrangement for compensating dispersion is a chirp in one or both DBRs 56, 58. Appropriate chirp in DBRs 56, 58 is obtained by setting different thicknesses (chirping) of adjacent layers 60, 62 and 64, 66. The amount of group velocity dispersion (GVD) and chirp DBR design necessary to compensate for the dispersion in radiation 72 is calculated from the bandwidth of radiation 72 and the dispersive properties of substrate 54 in accordance with well-known methods. For additional information the reader is referred to Kärtner F., et al., "Design and fabrication of double-chirped mirrors", Optics Letters, Vol. 22, No. 11, June 1997, pp. 831–833.

In general, curved reflectors and lenses can be used to minimize diffraction losses or stabilize resonator 52 such that most of the energy of radiation 72 is confined within resonator 52. Furthermore, in conjunction with defining appropriate apertures by limiting the size of reflectors 56, 58 one achieves a high level of discrimination between transverse modes of radiation 72. That is because fundamental transverse mode $TEM_{00}$ diffracts less than higher order transverse modes. If the apertures defined by reflectors 56, 58 are smaller than the higher modes, the latter will experience high losses while $TEM_{00}$ will experience smaller losses.

The arrangement for stabilizing resonator 52 in the present embodiment is the radius of curvature R and aperture of DBR 58. Specifically, the aperture of DBR 58 is chosen to be sufficiently small to prevent the establishment of transverse modes beyond the fundamental $TEM_{00}$ mode of radiation 72 in resonator 52. Preferably, radius R of DBR 58 is also equal to twice the length L of resonator 52. In this case resonator 52 forms a half confocal resonator. In addition to controlling transverse modes of radiation 72, half confocal geometry of resonator 52 is advantageous because it increases alignment tolerances between DBRs 56, 58.

During operation, pump device 80 delivers pump radiation 82, which enters resonator 52 through first DBR 56. Pump radiation 82 pumps active medium 68, which generates radiation 72 in accordance with the principles of stimulated emission. The length L of resonator 52 allows radiation 72 to resonate within resonator 52 in a significant number of axial modes. At the same time, the half confocal geometry of resonator 52 stabilizes resonator 52 such that radiation 72 resonates in only the fundamental transverse mode $TEM_{00}$. Radiation 72 experiences dispersion due to substrate 54. The effects of this dispersion are compensated by the chirp of DBRs 56 and 58.

Saturable absorber 74 determines the phase difference between the modes of radiation 72. Since absorber 74 is positioned at the end of resonator 52, it defines a constant phase difference $\phi$ between successive modes that leads to so-called fundamental mode-locking. Under fundamental mode-locking conditions output radiation 84 is made up of pulses 86 separated by a duration equal to 2Ln/c. In one specific case length L of resonator 52 is set by 500 $\mu$m thick substrate 54 and active medium 68 is made up of InGaAs a multiple quantum well (MQW) material. Under these conditions, when VCSEL 50 is pumped by pump radiation 82 to excite the 980 nm transition, active medium 68 emits radiation 72 at 980 nm at a repetition rate of 85.7 GHz. In general, when resonator 52 is extended such that it supports a large number of axial modes of radiation 72, for example more than 50 axial modes, the peak power of pulses 86 can reach levels of several Watts with pulse durations of less than a picosecond and repetition rates in the tens of GHz range.

Monolithically integrated and mode-locked VCSEL 50 is stable and overcomes the limitations of the prior art. All components of VCSEL 50 including the arrangements for stabilizing resonator 52 and dispersion compensation built into DBRs 56, 58 are produced on single substrate 54. This enables mass production of a large number of VCSELs 50 side-by-side, e.g., in a compact array format.

A person skilled in the art will appreciate that the principles of invention can be used to design a large variety of monolithically integrated, mode-locked VCSELs. In one alternative embodiment, the VCSEL can be designed to operate in a harmonic mode-locking condition that is achieved by placing saturable absorber 74 at various locations within resonator 52, e.g., in the middle of substrate 54. Alternatively, absorber 74 can be placed between alternating layers 64, 66 of DBR 58 to set up yet another fundamental mode-locking condition in which the saturation intensity of absorber 74 is increased. Also, it should be noted that controlling certain parameters of the quantum wells of active medium 68 within cavity 52 allows for spectral shaping of radiation 72 generated by medium 68. Specifically, the gain region in medium 68 can be tuned by tuning the gain peak of each quantum well using different well widths, by independently biasing the quantum wells, and by weighting the gain effects by placing the wells at proper points within the standing wave pattern of radiation 72 within resonator 52. A person skilled in the art will be familiar in how these principles can be applied, e.g., in order to obtain a flat spectrum of radiation 72.

Figure 3:
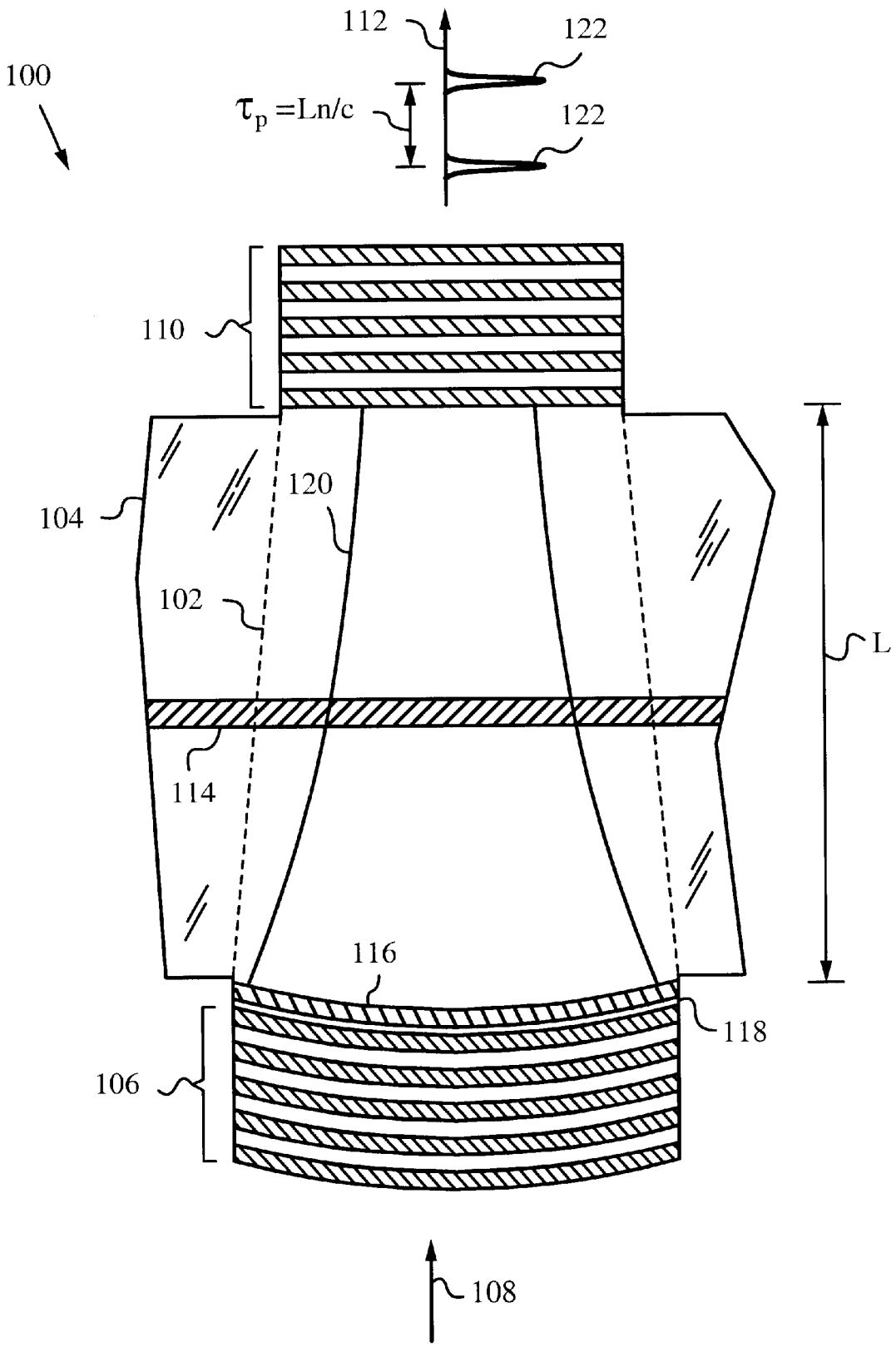
FIG. 3 is a cross sectional view of another optically pumped mode-locked VCSEL in accordance with the invention.

FIG. 3 illustrates another embodiment of a monolithically integrated, mode-locked VCSEL 100 with a resonator 102 whose length L is determined by a substrate 104, which is used as a spacer, analogous to the embodiment of FIG. 1. VCSEL 100 has a curved DBR 106 for in-coupling a pump radiation 108 into resonator 102 and a flat DBR 110 for out-coupling output radiation 112. A saturable absorber 114 is embedded inside substrate 104 in the middle of resonator 102. An active medium 116 is located next to DBR 106 and separated from it by a spacing layer 118. In accordance with the invention, length L is set sufficiently long to support within resonator 102 a significant number of axial modes of a radiation 120 generated by active medium 116 when pumped by pump radiation 108. As in the previous embodiment, the aperture of curved DBR 106 is limited and the radius of curvature of curved DBR 106 is preferably set to twice length L to render resonator 102 a half confocal resonator.

During operation VCSEL 100 receives pump radiation 108 through curved DBR 106. Pump radiation 108 induces active medium 116 to generate radiation 120. Resonator 102 designed in accordance with the invention supports a significant number of axial modes but only a single transverse mode, i.e., the fundamental TEM$_{00}$ mode of radiation 120. The location of saturable absorber 114 establishes a harmonic mode-locking condition (also called colliding-pulse condition). As a result, output radiation 112 exiting through DBR 110 consists of pulses 122 separated by a duration $\tau_p$ equal to Ln/c.

A person skilled in the art will recognize that the embodiments described above can be adapted to use the same DBR for in-coupling pump radiation and for out-coupling output radiation. In fact, either the curved or flat DBRs can serve this dual purpose. In addition, the pump beam may be delivered from the side (side-pumping) in an alternative geometry and with appropriate placement of the active medium. In all embodiments, the exact placement of the saturable absorber should be selected such that it does not interfere with the optical pumping. In other words, it is preferable that the pump radiation in-coupled into the resonator is incident primarily or at least first on the active medium rather than the saturable absorber.

Figure 4:
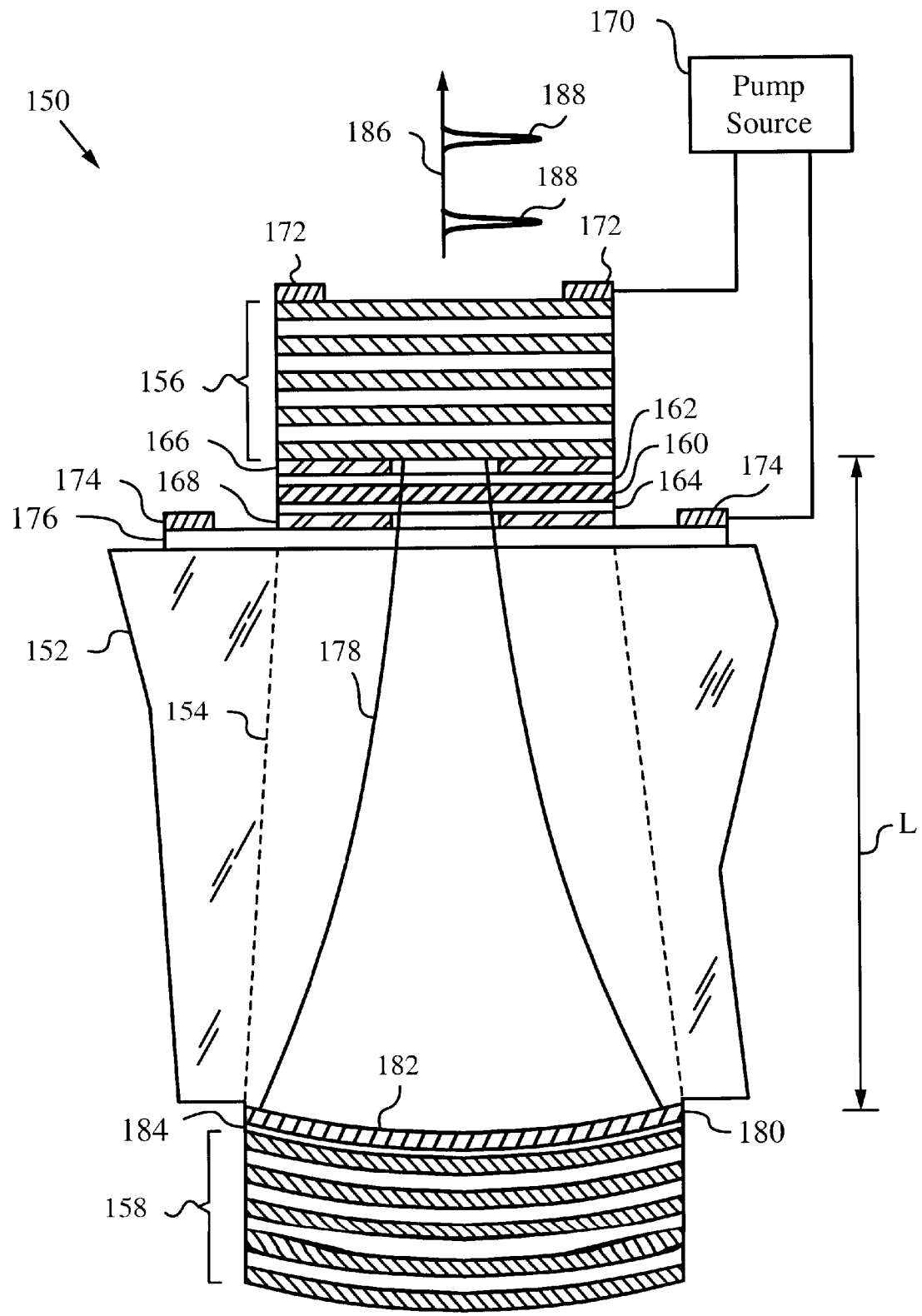
FIG. 4 is a cross-sectional view of an electrically pumped mode-locked VCSEL in accordance with the invention.

Yet another embodiment of a VCSEL 150 n accordance with the invention is designed for direct electrical pumping, as shown in FIG. 4. VCSEL 150 is built on a substrate 152 and has a resonator 154 of length L. Resonator 154 has a first DBR 156 that is flat and a second DBR 158 that is curved for stabilizing resonator 154. DBR 156 is selected to have appropriate reflectivity to act as an output coupler. DBR 158 is chirped to compensate for dispersion and is selected to have appropriate reflectivity to act as a high reflector.

An active medium 160, preferably containing a number of quantum wells placed within the intrinsic region of a PIN diode, is positioned below DBR 156. Medium 160 is sandwiched between two contact layers 162, 164 and oxide apertures 166, 168.

An electrical pumping device or pump source 170 is connected to a top contact 172 and a bottom contact 174. Bottom contact 174 is located on a current spreading layer 176. Current spreading layer 176 is in electrical contact with medium 160. Pump source 170 is designed to produce current flow between contacts 172 and 174 and through medium 160. The passage of current through medium 160 causes generation of a radiation 178. In accordance with the invention, length L is extended by substrate 152 to be of sufficient length to support a significant number of axial modes of radiation 178 in resonator 154.

A saturable absorber 180 is grown next to DBR 158 on top of a curved surface 182 of substrate 152. A spacing layer 184 separates absorber 180 from DBR 158. Absorber 180 is located on opposite end of resonator 154 from medium 160 in order not to interfere with the pumping.

During operation medium 160 is pumped by source 170 by applying a current between contacts 172 and 174. The positioning of contacts 172 and 174 apart from each other, preferably far apart, ensures good uniformity of current flow across the horizontal extent of medium 160. Oxide apertures 162, 164 guide the current through the center of medium 160. Current spreading layer 176 distributes the current homogeneously across medium 160.

In response to the current, medium 160 generates radiation 178 in a number of axial modes. Absorber 180 mode-locks radiation 178 in the fundamental mode-locking condition. An output radiation 186 containing pulses 188 issues from VCSEL 150 through DBR 156, which acts as the output coupler.

VCSEL 150 is compact and independent. Electrically pumped VCSEL 150 may be preferable to the optically pumped VCSELs in certain applications, as will be appreciated by those skilled in the art. Of course, many conventional VCSEL design techniques can be implemented to improve the efficiency of VCSEL 150 and/or adapt VCSEL 150 to any particular application. For example, in an alternative embodiment, contact 174 can be provided at the bottom of VCSEL 150 near DBR 158. In another embodiment the positions of medium 160 and absorber 180 can be swapped. In yet another embodiment, the reflectivities of the DBRs can be adjusted such that DBR 158 is the output coupler and DBR 156 is the high reflector.

Figure 5:
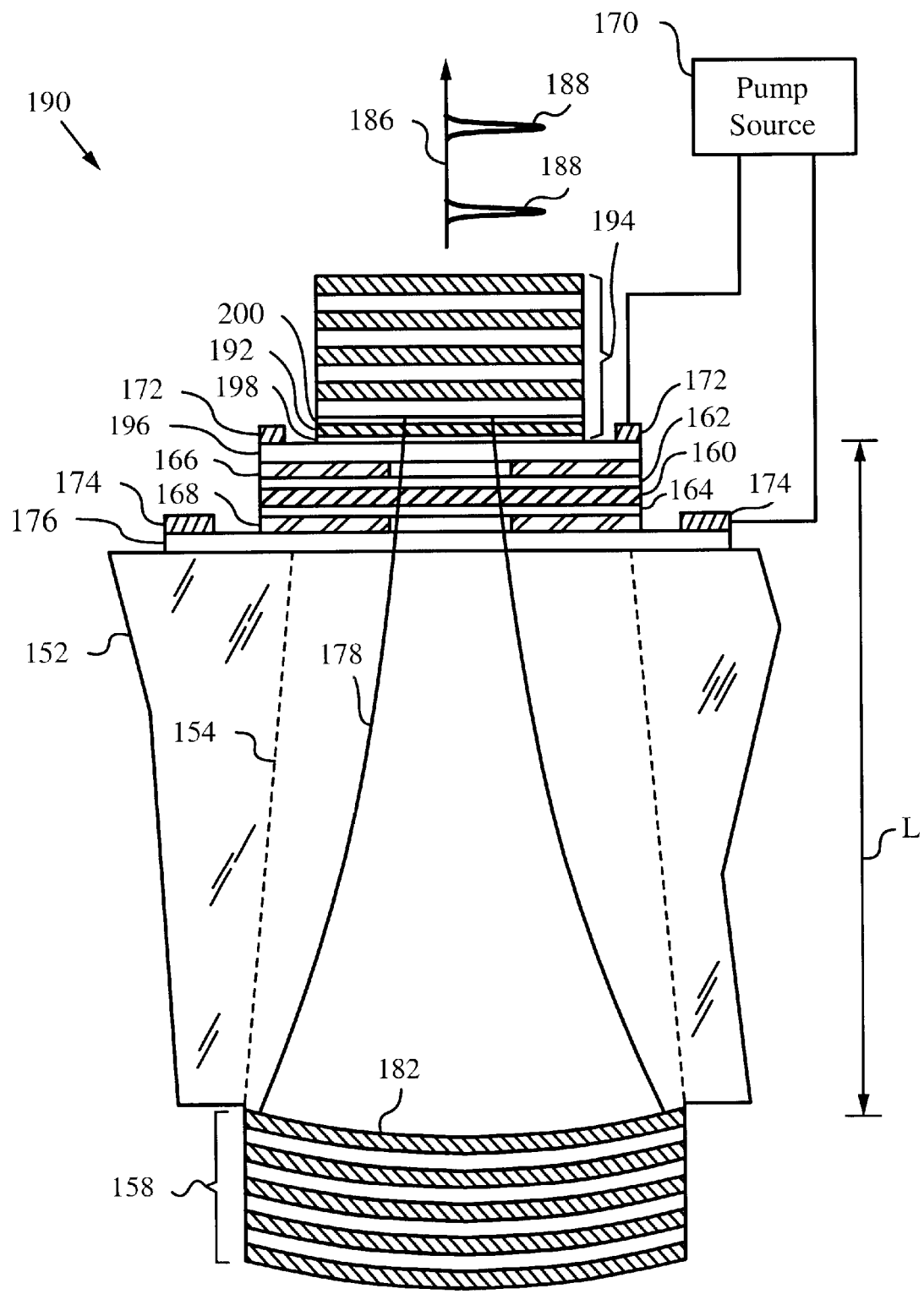
FIG. 5 is a cross-section of another electrically pumped mode-locked VCSEL.

Yet another embodiment of VCSEL 190 is shown in FIG. 5, where medium 160 and a saturable absorber 192 are located at the same end of resonator 154. In this drawing parts corresponding to those in FIG. 4 are labeled with the same reference numbers.

Resonator 154 is defined between a first flat DBR 194 and curved DBR 158. DBR 194 is grown on top of an additional current spreading layer 196. Top contact 172 is also located on top of current spreading layer 196 around DBR 194. Absorber 192 is integrated into DBR 194. Specifically, absorber 192 is sandwiched between two separating layers 198, 200 within DBR 194.

During operation source 170 applies a current between top contact 172 located on current spreading layer 196 and bottom contact 174 on current spreading layer 176. Thus, current flows uniformly through the layers containing medium 160, but does not flow through absorber 192 placed within DBR 194. In this manner interference between electrical pumping of medium 160 and the action of absorber 192 is prevented. The substrates used in any of the above embodiments can be made of unmodified substrate material with the corresponding structures including the reflectors, absorbers, and active media grown or deposited on both sides. Alternatively, the structures can be modified by growth, re-growth, etching and bonding. These techniques can be used to achieve a variety of objectives, including a reduced substrate absorption, thickness adjustability and lower wavelength dispersion.

Figure 6:
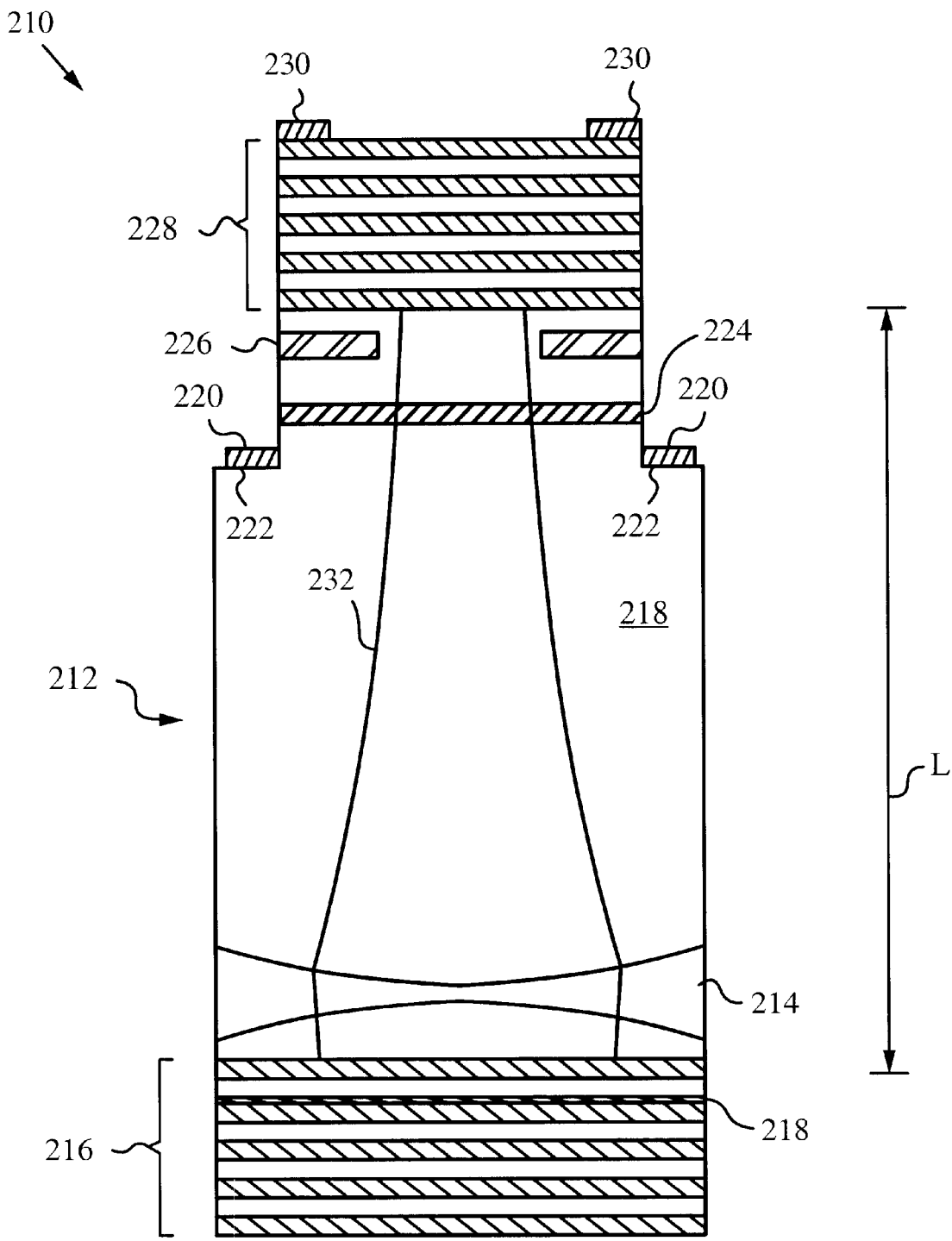
Fig. 6 is a cross sectional view illustrating the use of a microlens for stabilizing a resonator in a mode-locked VCSEL in accordance with the invention.

In yet another embodiment a mode-locked VCSEL 210 has a stable resonator 212 designed by replacing curved DBR by an optically equivalent combination of a lensing element 214 followed by a flat mirror or reflector 216, as shown in the cross-sectional view in FIG. 6. Preferably, lensing element 214 is a microlens formed by a side oxidation technique known in the art. For example, refractive microlens 214 can be a layered microlens fabricated by depositing a stack of layers with different compositions, etching through the stack to expose the outer layer edges, and then selectively oxidizing certain layers inwardly from the outer edges, thereby obtaining a lateral index profile that acts as an optical lens. Using alternating layers of GaAs and high-aluminum concentration AlGaAs, and selectively oxidizing the AlGaAs layers using elevated temperatures in an oxygen-rich environment is a preferred embodiment of this concept.

In this embodiment reflector 216 is a flat DBR and a saturable absorber 218 is integrated into DBR 216. DBR 216 is chirped to provide for dispersion compensation.

VCSEL 210 is built on a substrate 218 and is designed for electrical pumping of an active medium 224. A bottom contact 220 is provided on a ledge 222 in substrate 218. Medium 224, in the present case an InGaAs MQW, is provided above contact 220. An aluminum oxide aperture 226 is located above medium 224 for current guidance. A second flat reflector 228, also in the form of a DBR, is located above aperture 226. A top contact 230 is deposited on top of DBR 228.

Resonator 212 of VCSEL 210 has a length L sufficient to support a significant number of axial modes of a radiation 232. Radiation 232 is generated by medium 224 when a current is applied between contacts 230 and 220 by a pump source (not shown). Microlens 214 in combination with reflector 216 stabilize resonator 212 such that only the fundamental $TEM_{00}$ transverse mode of radiation 232 is supported in resonator 212. The chirp in DBR 216 compensates for wavelength dispersion occurring to radiation 232 in resonator 212. Meanwhile, absorber 218 enforces the fundamental mode-locking condition such that the output radiation of VCSEL 210 contains pulses separated by a duration 2Ln/c (not shown).

Monolithically integrated, mode-locked VCSELs fabricated in accordance with the invention can be used in many applications requiring compact, subpicosecond pulses. For example, large bandwidth short pulses produced by the VCSELs of the invention can be used for wavelength division multiplexed (WDM) applications and systems. The high repetition rates achievable with the VCSELs of invention also render them useful for optical time domain multiplexed (OTDM) systems and sampling applications. The low jitter of the pulses enables the use of the VCSELs in timing applications, such as providing clock signals for integrated circuits.

Other techniques, in conjunction with passive mode-locking, can be utilized to achieve better performance of VCSELs according to the invention in optical systems. Hybrid mode-locking uses an external signal to synchronize the pulses and reduce jitter. Arrays of mode-locked VCSELs emitting pulses in phase can be implemented using this technique. Subharmonic mode-locking is another hybrid technique that synchronizes the output of a mode-locked laser to a reference signal of lower frequency. Subharmonic mode-locked VCSELs can be used for OTDM and clock distribution systems where higher frequency clocks with low jitter need to be generated from slower signals.

The high peak powers of the ultrafast pulses obtained with mode-locked VCSELs of the present invention are also interesting for non-linear optics and bio applications. Many of the non-linear effects are only seen at high electric fields. A compact mode-locked VCSEL used as source can be easily coupled into fibers and enable the utilization of such effects in telecommunication systems or research. Two-photon absorption microscopy relies on the peak powers of mode-locked lasers to excite specific transitions in biological samples with higher signal to noise ratio detection while preserving the integrity of the sample. A low-cost, compact mode-locked VCSEL in accordance with the invention will produce sufficiently high beam quality to be attractive for these applications.

It will be clear to one skilled in the art that the above embodiments may be altered in many ways without departing from the scope of the invention. Accordingly, the scope of the invention should be determined by the following claims and their legal equivalents.

What is claimed is:

1. A multimode vertical cavity surface emitting laser (VCSEL), the VCSEL comprising:

an active medium for emitting radiation at a lasing wavelength;

a resonator, within which the active medium resides, the resonator including a semi-insulating substrate, the resonator having a first end and a second end with a length therebetween set to support the multimode;

a first reflector at the first end of the resonator;

a second reflector at the second end of the resonator;

a saturable absorber coupled to the resonator, whereby the saturable absorber is able to absorbing slow and low power components of the multimode such that only high power mode-locked pulses pass therethrough; and a means for stabilizing the resonator to reduce diffraction losses.

2. A multimode vertical cavity surface emitting laser (VCSEL), the VCSEL comprising:

an active medium for emitting radiation at a lasing wavelength;

a resonator, within which the active medium resides, the resonator including a substantially electrically insulating substrate, the resonator having a first end and a second end with a length therebetween set to support the multimode;

a first reflector at the first end of the resonator;

a second reflector at the second end of the resonator;

a saturable absorber coupled to the resonator, whereby the saturable absorber is able to absorbing slow and low power components of the multimode such that only high power mode-locked pulses pass therethrough; and a means for stabilizing the resonator to reduce diffraction losses.

3. A multimode vertical cavity surface emitting laser (VCSEL), the VCSEL comprising:

an active medium for emitting radiation at a lasing wavelength;

a resonator, within which the active medium resides, the resonator including a transparent substrate, the resonator having a first end and a second end with a length therebetween set to multimode;

a first reflector at the first end of the resonator;

a second reflector at the second end of the resonator;

a saturable absorber coupled to the resonator, whereby the saturable absorber is able to absorbing slow and low power components of the multimode such that only high power mode-locked pulses pass therethrough; and means for stabilizing the resonator includes a lensing element.

4. The VCSEL, according to claim 3, wherein:

the first reflector is a distributed Bragg reflector that is made integral with the substrate.

5. The VCSEL, according to claim 4, wherein the saturable absorber is made integral with the substrate.

6. The VCSEL, according to claim 5, wherein the second reflector is a distributed Bragg reflector that is deposited on the substrate.

7. The VCSEL, according to claim 4, wherein the distributed Bragg reflector is produced by epitaxial growth on the substrate.

8. The VCSEL, according to claim 3, wherein the lensing element is a microlens.

9. The VCSEL, according to claim 3, wherein:

the radiation includes a fundamental transverse mode and the VCSEL further comprises at least one aperture to limit all transverse modes but the fundamental transverse mode.

10. The VCSEL, according to claim 3, wherein the means for stabilizing the resonator comprises a curvature of the first reflector.

11. The VCSEL, according to claim 10, wherein the curvature is defined by a radius of curvature and the length of the resonator is equal to twice the radius of curvature.

12. The VCSEL, according to claim 11, wherein:

the radiation includes a fundamental transverse mode and the VCSEL further comprises at least one aperture to limit all transverse modes but the fundamental transverse mode.

13. The VCSEL, according to claim 3, further comprising a means for compensating for dispersion of the radiation in the resonator.

14. The VCSEL, according to claim 13, wherein the first reflector is a distributed Bragg reflector and the means for compensating for dispersion includes the introduction of a chirp in the distributed Bragg reflector.

15. The VCSEL, according to claim 3, further comprising a pumping device for pumping the active medium.

16. The VCSEL, according to claim 15, wherein:

the active medium is disposed near to the first end of the resonator;

the saturable absorber is disposed nearto the second end of the resonator; and the pumping device has the capability for optical pumping.

17. The VCSEL, according to claim 15, wherein:

the pumping device has the capability for electrical pumping.

18. The VCSEL, according to claim 17, wherein:

the pumping device is disposed nearto the first end of the resonator;

the pumping device is coupled to first and second electrical contacts;

and both first and second electrical contacts are disposed nearer to the first end of the resonator than the second end of the resonator.

* * * * *